United States Patent
Chang et al.

(10) Patent No.: US 9,761,319 B1
(45) Date of Patent: Sep. 12, 2017

(54) READING METHOD FOR PREVENTING READ DISTURBANCE AND MEMORY USING THE SAME

(71) Applicant: MACRONIX INTERNATIONAL CO., LTD., Hsinchu (TW)

(72) Inventors: Kuo-Pin Chang, Miaoli County (TW); Teng-Hao Yeh, Hsinchu (TW); Hang-Ting Lue, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/344,614

(22) Filed: Nov. 7, 2016

(51) Int. Cl.
| | |
|---|---|
| *G11C 16/16* | (2006.01) |
| *G11C 16/34* | (2006.01) |
| *G11C 16/26* | (2006.01) |
| *G11C 16/04* | (2006.01) |
| *G11C 16/08* | (2006.01) |
| *G11C 16/14* | (2006.01) |

(52) U.S. Cl.
CPC ...... *G11C 16/3427* (2013.01); *G11C 16/0483* (2013.01); *G11C 16/08* (2013.01); *G11C 16/26* (2013.01); *G11C 16/14* (2013.01); *G11C 16/16* (2013.01); *G11C 16/3445* (2013.01)

(58) Field of Classification Search
CPC ...... G11C 16/16; G11C 16/14; G11C 16/3445
USPC ........................................ 365/185.29, 185.18
See application file for complete search history.

(56) References Cited

U.S. PATENT DOCUMENTS

| | | | |
|---|---|---|---|
| 2011/0194357 A1* | 8/2011 | Han | G11C 16/16 365/185.29 |
| 2014/0010020 A1 | 1/2014 | Fukuda | |
| 2014/0160847 A1 | 6/2014 | Kwak | |

OTHER PUBLICATIONS

TIPO Office Action dated Apr. 20, 2017 in Taiwan application (No. 105136272).

* cited by examiner

*Primary Examiner* — Jason Lappas
(74) *Attorney, Agent, or Firm* — McClure, Qualey & Rodack, LLP

(57) ABSTRACT

A reading method for preventing a read disturbance and a memory using the same are provided. The reading method includes the following steps: At least one of a plurality of string select lines is selected and a predetermined string select voltage is applied to the selected string select line. Only one of a plurality of ground select lines is selected and a predetermined ground select voltage is applied to the selected ground select line.

17 Claims, 6 Drawing Sheets

READING METHOD FOR PREVENTING READ DISTURBANCE AND MEMORY USING THE SAME

TECHNICAL FIELD

The disclosure relates in general to a reading method and a memory using the same, and more particularly to a reading method for preventing a read disturbance and a memory using the same.

BACKGROUND

Along with the development of storage technology, various memories are invented. Digital data can be written/programmed into the memory and then those digital data can be read out.

The reading method of the memory may cause nearby cells in the same memory block to change over time. This is known as read disturb (or read disturbance). To avoid the read disturbance problem, the controller may typically count the total number of reads to a block since the last erase. When the total number of reads exceeds a target limit, the data stored in the affected block will be copied to a new block, and then the affected block is erased. The affected block is as good as new after the erasing. However, it costs time to copy the data of the affect block and some of the data may be lost before the total number of reads exceeds the target limit.

SUMMARY

The disclosure is directed to a reading method and a memory using the same. When reading a selected cell, only one of a plurality of ground select lines is selected to be applied a predetermined ground select voltage. The voltage difference between the gate and the channel in each unselected cell can be reduced. As such, the read disturbance can be prevented.

According to one embodiment, a reading method of a memory for preventing a read disturbance is provided. The reading method includes the following steps: At least one of a plurality of string select lines is selected and a predetermined string select voltage is applied to the selected string select line. Only one of a plurality of ground select lines is selected and a predetermined ground select voltage is applied to the selected ground select line.

According to another embodiment, a memory is provided. The memory includes a plurality of string select lines and a plurality of ground select lines. At least one of the string select lines is selected by a decoder, and a predetermined string select voltage is applied to the selected string select line. Only one of the ground select lines is selected by the decoder, and a predetermined ground select voltage is applied to the selected ground select line.

Figure 1:
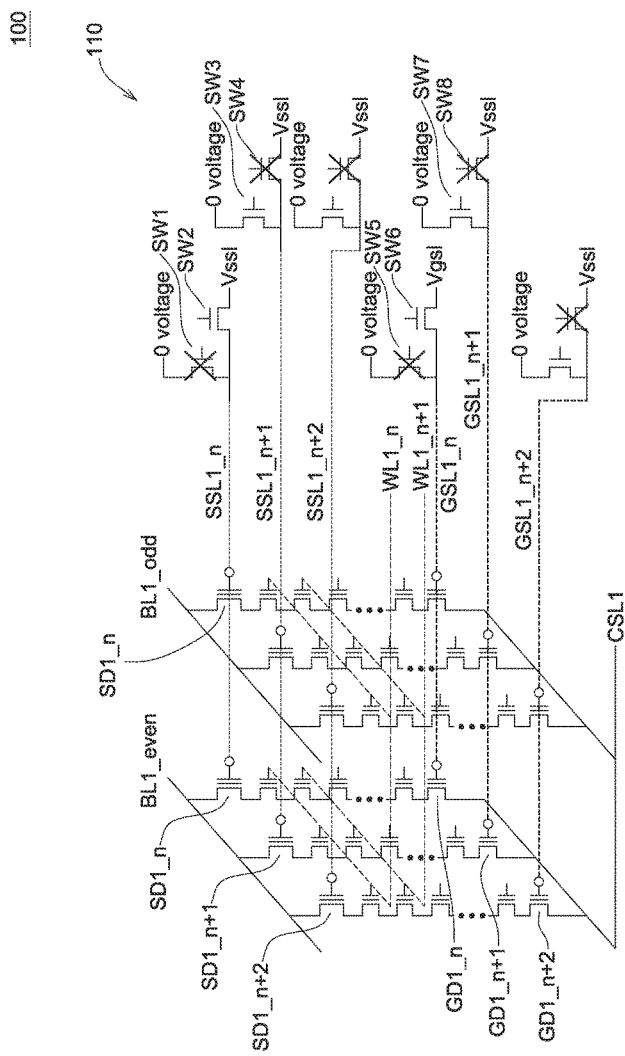
FIG. 1 shows a memory according to an embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Please refer to FIG. 1, which shows a memory 100 according to an embodiment. The memory 100 may be a 3D VNAND Flash memory. The memory 100 includes a plurality of strings. Each string includes a plurality of memory cells. The memory 100 includes a plurality of even bit lines BL1_even, a plurality of odd bit lines BL1_odd, a plurality of word lines WL1_$n$, WL1_$n$+1, . . . , a plurality of string select lines SSL1_$n$, SSL1_$n$+1, SSL1_$n$+2, . . . , a plurality of ground select lines GSL1_$n$, GSL1_$n$+1, GSL1_$n$+2, . . . , and a common source line CSL1. One end of each string is connected to the common source line CSL1, and the other end of each string is connected to the even bit lines BL1_even or the odd bit lines BL1_odd.

The string select lines SSL1_$n$, SSL1_$n$+1, SSL1_$n$+2, . . . are used to turn on or turn off SSL devices SD1_$n$, SD1_$n$+1, SD1_$n$+2, . . . respectively. The SSL devices SD1_$n$ are controlled by the string select line SSL1_$n$, the SSL devices SD1_$n$+1 are controlled by the string select line SSL1_$n$+1, the SSL devices SD1_$n$+2 are controlled by the string select line SSL1_$n$+2, and so on. For example, if the SSL devices SD1_$n$ are turned on, the voltage provided from the even bit lines BL1_even (or the odd bit lines BL1_odd) can be applied into the strings connected the SSL devices SD1_$n$.

The ground select lines GSL1_$n$, GSL1_$n$+1, GSL1_$n$+2, . . . are used to turn on or turn off GSL devices GD1_$n$, GD1_$n$+1, GD1_$n$+2, . . . respectively. The GSL devices GD1_$n$, GD1_$n$+1, GD1_$n$+2, . . . are not controlled by the same ground select line. Instead, the GSL devices GD1_$n$ are controlled by the ground select line GSL1_$n$, the GSL devices GD1_$n$+1 are controlled by the ground select line GSL1_$n$+1, the GSL devices GD1_$n$+2 are controlled by the ground select line GSL1_$n$+2, and so on. For example, if the GSL devices GD1_$n$ are turned on, the voltage provided from the common source line CSL1 can be applied into the strings connected the GSL devices GD1_$n$.

The word lines WL1_$n$, WL1_$n$+1, . . . are respectively connected to the memory cells in each string.

In this embodiment, the string select lines SSL1_$n$, SSL1_$n$+1, SSL1_$n$+2, . . . respectively correspond to the ground select lines GSL1_$n$, GSL1_$n$+1, GSL1_$n$+2, . . . . One of the string select lines SSL1_$n$, SSL1_$n$+1, SSL1_$n$+2, . . . and one of the ground select lines GSL1_$n$, GSL1_$n$+1, GSL1_$n$+2, . . . can be selected by a decoder 110. In one embodiment, the ground select lines GSL1_$n$, GSL1_$n$+1, GSL1_$n$+2, . . . can be decoded separately. For example, switch SW1 can be turned off and switch SW2 can be turned on to apply a predetermined string select voltage Vssl to the string select line SSL1_$n$; and switch SW3 can be turned on and switch SW4 can be turned off to apply 0 voltage to the string select line SSL1_$n$+1. Switch SW5 can be turned off and switch SW6 can be turned on to apply the predetermined ground select voltage Vgsl to the ground select line GSL1_$n$, and switch SW7 can be turned on and switch SW8 can be turned off to apply 0 voltage to the ground select line GSL1_$n$+1.

Figure 2:
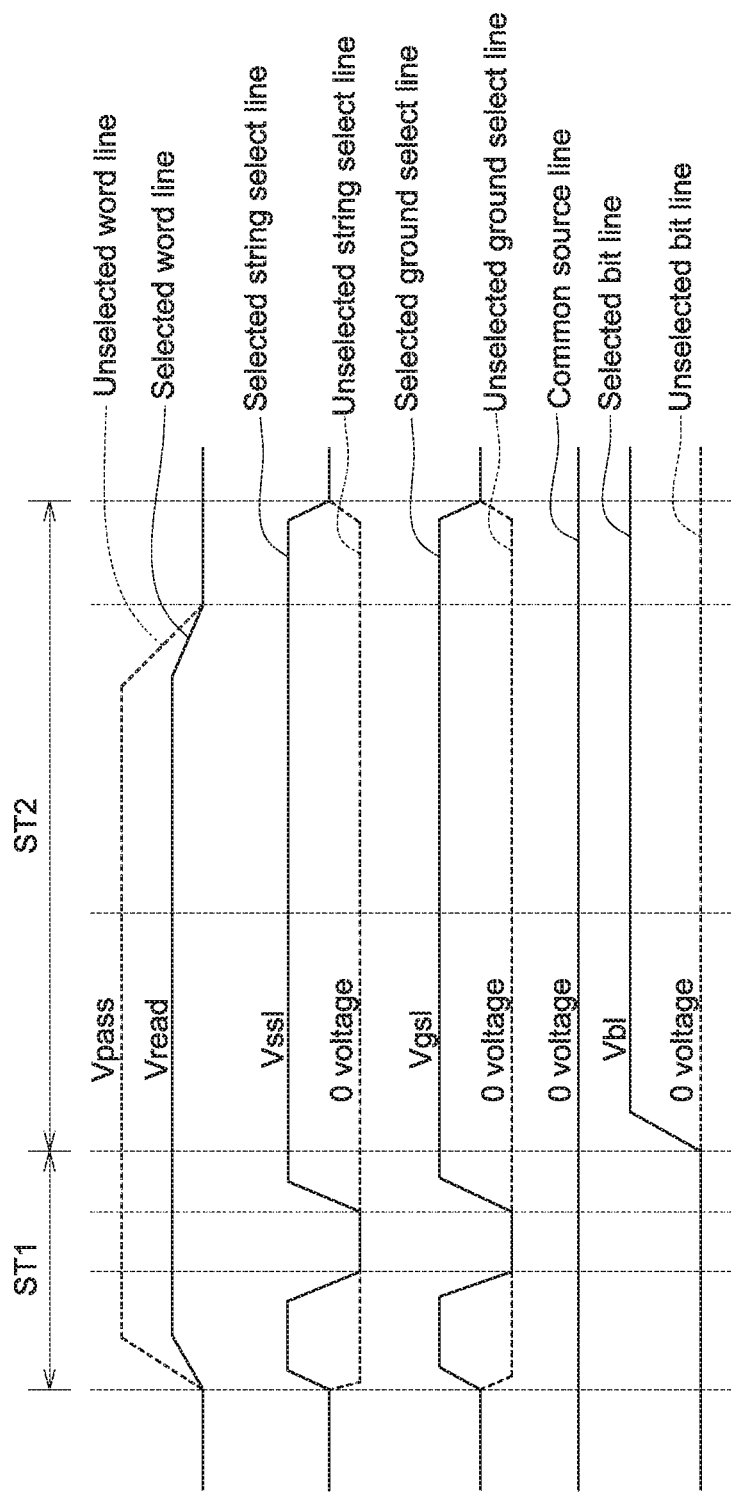
FIG. 2 shows a waveform during a forward read operation of the memory.

Please refer to FIG. 2, which shows a waveform during a forward read operation of the memory 100. The read operation includes a pre-on setup stage ST1 and a sense developing stage ST2. In the sense developing stage ST2, the reading method of the memory 100 includes the following steps. Those steps may be substantially performed at the same time.

One of the word lines WL1_$n$, WL1_$n$+1, . . . is selected. The selected word line is applied a varied read voltage Vread, and the unselected word line is applied a pass voltage Vpass.

One of the string select lines SSL1_$n$, SSL1_$n$+1, SSL1_$n$+2, . . . is selected. The selected string select line is applied the predetermined string select voltage Vssl; the unselected string select line is applied 0 voltage.

One of the ground select lines GSL1_$n$, GSL1_$n$+1, GSL1_$n$+2, . . . is selected. The selected ground select line is applied the predetermined ground select voltage Vgsl; the unselected ground select line is applied 0 voltage.

The common source line CSL1 is applied 0 voltage. The even bit lines BL1_even or the odd bit lines BL1_odd are selected. The selected bit lines are applied a predetermined bit line voltage Vbl; the unselected bit lines are applied 0 voltage.

In this embodiment, not all of the ground select lines GSL1_$n$, GSL1_$n$+1, GSL1_$n$+2, . . . are applied the predetermined ground select voltage Vgsl. Therefore, not all of the GSL devices GD1_$n$, GD1_$n$+1, GD1_$n$+2 are turned on and not all of the strings are applied 0 voltage provided from the common source line CSL1.

Figure 3:
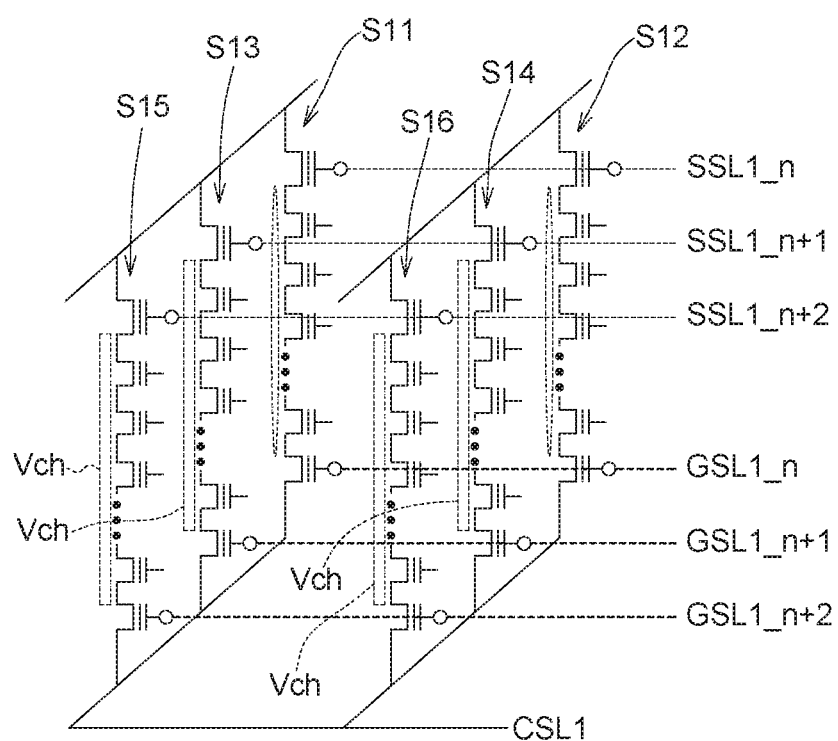
FIG. 3 shows the channel potential in the memory.

Please refer to FIG. 3, which shows the channel potential in the memory 100. In FIG. 3, the strings S11, S12 are selected to be read, and the strings S13, S14, S15, S16, . . . are unselected. The unselected strings S13, S14, S15, S16 are floating. A channel potential of each of the strings S13, S14, S15, S16, . . . is boosted to be a predetermined voltage level Vch. Therefore, the voltage difference between the gate and the channel in each unselected cell in the strings S13, S14, S15, S16 can be reduced from "the difference between the pass voltage Vpass and 0 V" to "the difference between the pass voltage Vpass and the predetermined voltage level Vch." Because the voltage difference in the unselected cell is reduced, the read disturbance can be prevented.

Figure 4:
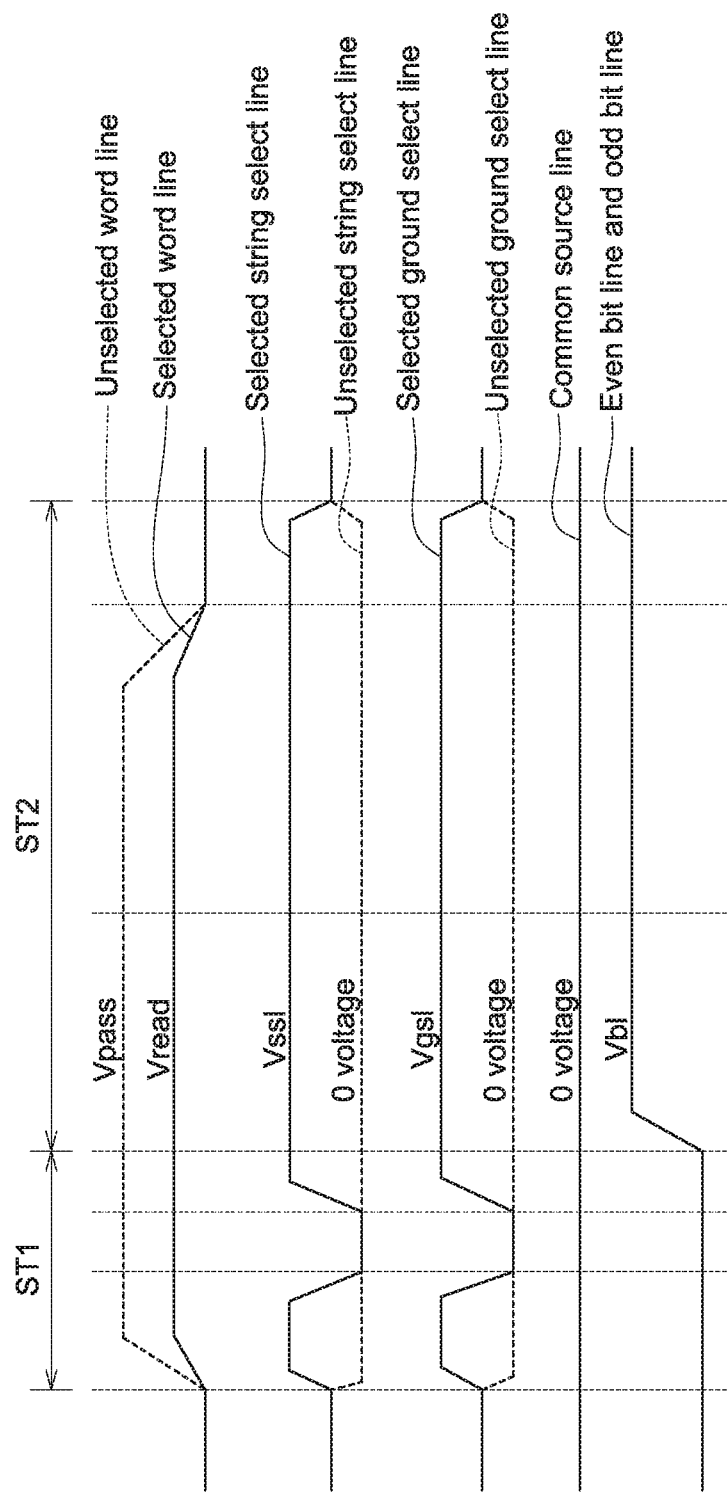
FIG. 4 shows a waveform during an all bit lines sensing operation of the memory.

Please refer to FIG. 4, which shows a waveform during an all bit lines sensing operation of the memory 100. In another embodiment, all of the even bit lines BL1_even and the odd bit lines BL1_odd can be selected to apply the predetermined bit line voltage Vbl. In this embodiment, the channel potential is similar to FIG. 3. The voltage difference between the gate and the channel in each unselected cell in the strings S13, S14, S15, S16 can also be reduced from "the difference between the pass voltage Vpass and 0 V" to "the difference between the pass voltage Vpass and the predetermined voltage level Vch." Because the voltage difference in the unselected cell is reduced, the read disturbance can be prevented.

Figure 5:
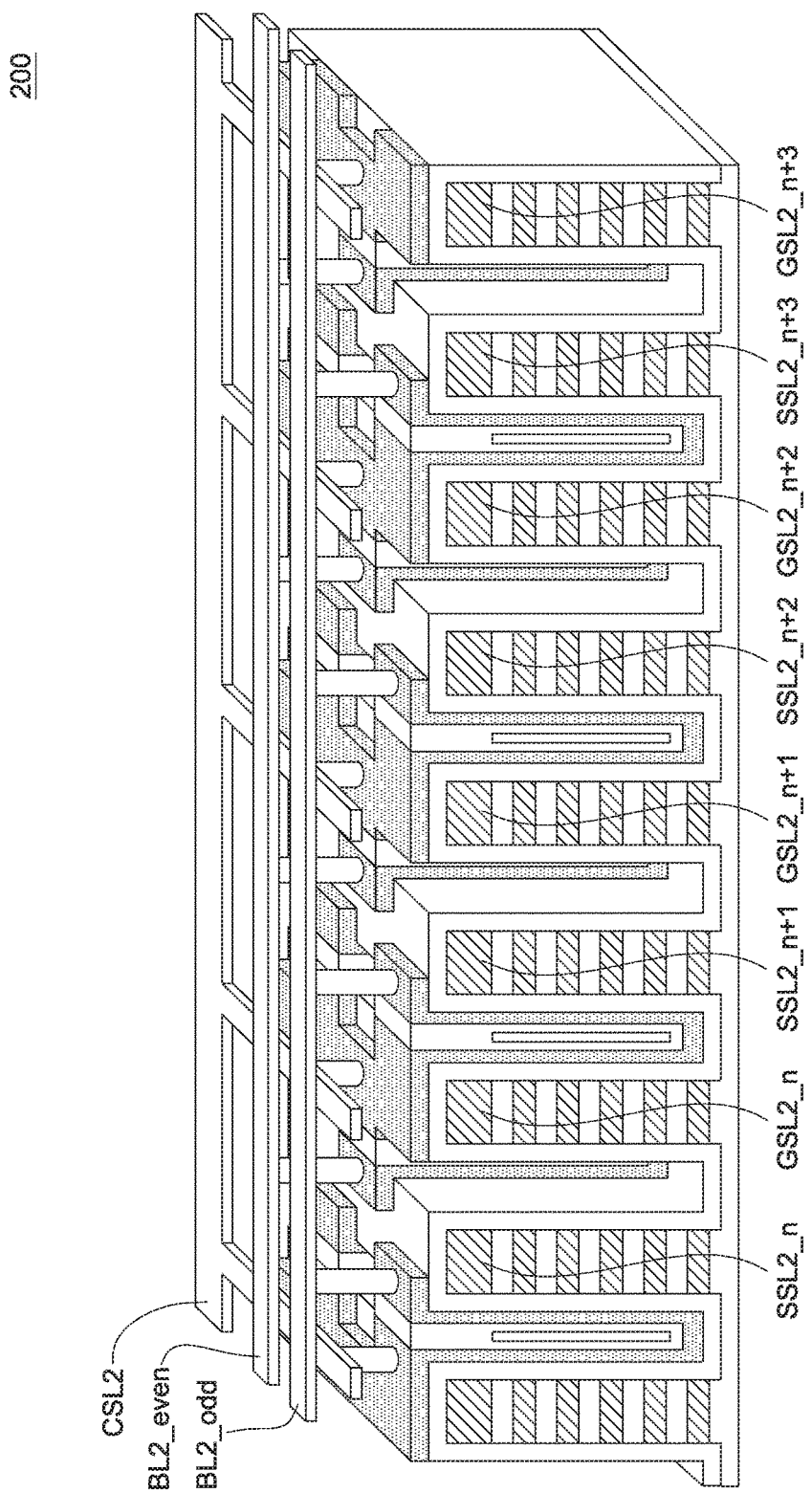
FIG. 5 shows a memory according to another embodiment.

Please refer to FIG. 5, which shows a memory 200 according to another embodiment. The memory 200 may be a 3D SGVC memory. The memory 200 includes a plurality of strings. Each string includes a plurality of memory cells. The memory 200 includes a plurality of even bit lines BL2_even, a plurality of odd bit lines BL2_odd, a plurality of word lines, a plurality of string select lines SSL2_$n$, SSL2_$n$+1, SSL2_$n$+2, SSL2_$n$+3, a plurality of ground select lines GSL2_$n$, GSL2_$n$+1, GSL2_$n$+2, GSL2_$n$+3, and a common source line CSL2.

Figure 6:
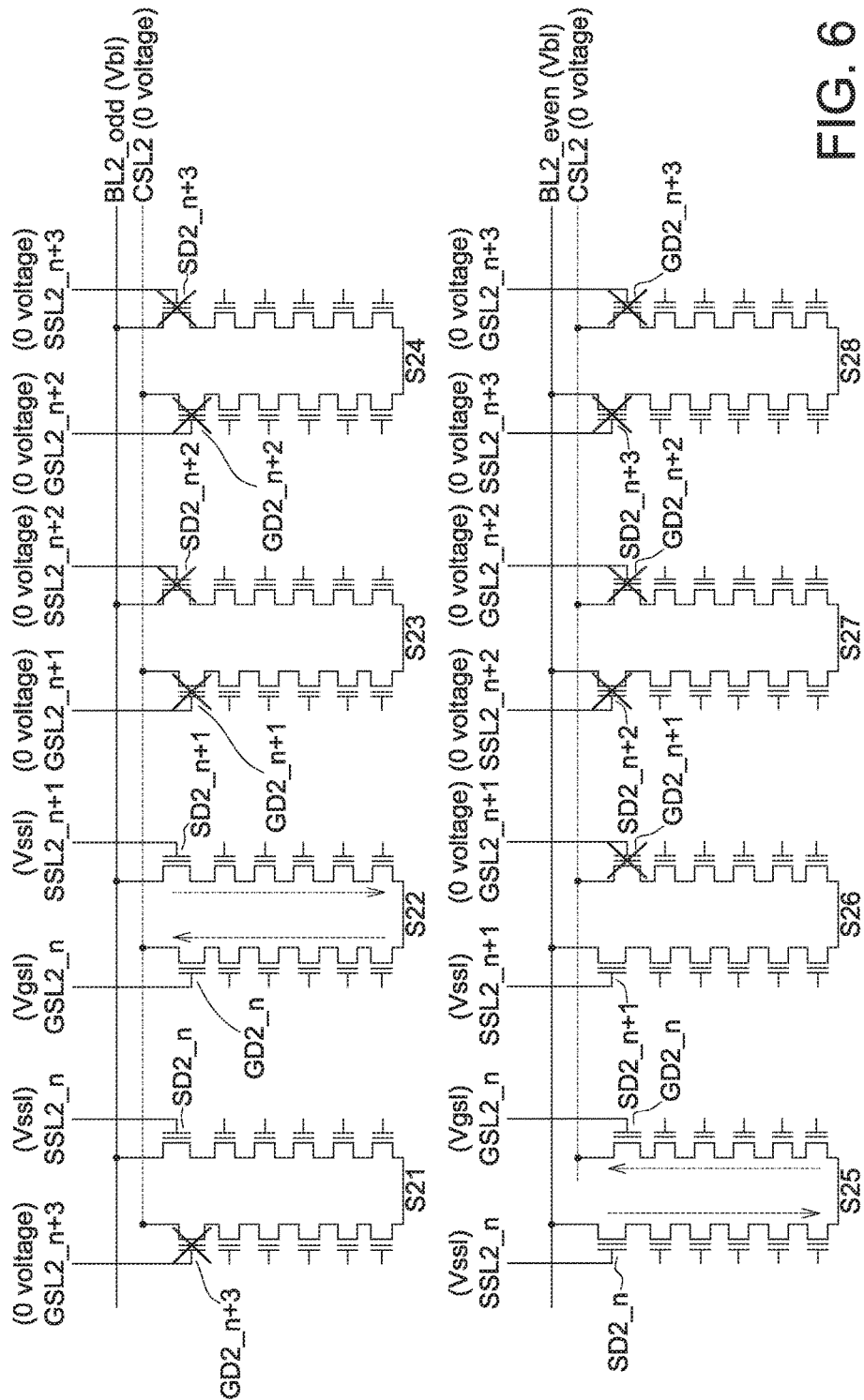
FIG. 6 shows several strings of the memory.

Please refer to FIG. 6, which shows several strings S21 to S28 of the memory 200. One end of each of the strings S21 to S28 is connected to the common source line CSL2, and the other end of each of the strings S21 to S28 is connected to the even bit lines BL2_even or the odd bit lines BL2_odd.

The string select lines SSL2_$n$, SSL2_$n$+1, SSL2_$n$+2, SSL2_$n$+3 are used to turn on or turn off SSL devices SD2_$n$, SD2_$n$+1, SD2_$n$+2, SD2_$n$+3 respectively. The SSL devices SD2_$n$ are controlled by the string select line SSL2_$n$, the SSL devices SD2_$n$+1 are controlled by the string select line SSL2_$n$+1, the SSL devices SD2_$n$+2 are controlled by the string select line SSL2_$n$+2, and the SSL devices SD2_$n$+3 are controlled by the string select line SSL2_$n$+3. For example, if the SSL devices SD2_$n$ are turned on, the voltage provided from the odd bit lines BL2_odd (or the even bit lines BL1_even) can be applied into the string S21 (or the string S25) connected the SSL devices SD2_$n$.

The ground select lines GSL2_$n$, GSL2_$n$+1, GSL2_$n$+2, GSL2_$n$+3 are used to turn on or turn off GSL devices GD2_$n$, GD2_$n$+1, GD2_$n$+2, GSL2_$n$+3 respectively. The GSL devices GD2_$n$, GD2_$n$+1, GD2_$n$+2, GSL2_$n$+3 are not controlled by the same ground select line.

Instead, the GSL devices GD2_$n$ are controlled by the ground select line GSL2_$n$, the GSL devices GD2_$n$+1 are controlled by the ground select line GSL2_$n$+1, the GSL devices GD2_$n$+2 are controlled by the ground select line GSL2_$n$+2, and the GSL devices GD2_$n$+3 are controlled by the ground select line GSL2_$n$+3. For example, if the GSL devices GD2_$n$ are turned on, the voltage provided from the common source line CSL2 can be applied into the strings S22, S25 connected the GSL devices GD2_$n$.

In the all bit lines sensing scheme embodiment, the strings S22, S25 are regarded as one page, the strings S23, S26 are regarded as one page, and the strings S24, S27 are regarded as one page, and the strings S21, S28 are regarded as one page.

In FIG. 6, the strings S22, S25 are read. The strings S23, S24, S27, S28 are floating. A channel potential of each of the strings S23, S24, S27, S28 is boosted to be the predetermined voltage level Vch. Therefore, the voltage difference between the gate and the channel in each unselected cell in the strings S23, S24, S27, S28 can be reduced from "the difference between the pass voltage Vpass and 0 V" to "the difference between the pass voltage Vpass and the predetermined voltage level Vch." Furthermore, the SSL device SD2_$n$ is turned on by the string select line SSL2_$n$, so the channel potential of the string S21 is induced to be the predetermined bit line voltage Vbl provided from the odd bit line BL2_odd. And the SSL device SD2_$n$+1 is turned on by the string select line SSL2_$n$+1, so the channel potential of the string S26 is induced to be the predetermined bit line voltage Vbl provided from the even bit line BL2_even. Therefore, the voltage difference between the gate and the channel in each unselected cell in the strings S21, S26 can be reduced from "the difference between the pass voltage Vpass and 0 V" to "the difference between the pass voltage Vpass and the predetermined bit line voltage Vbl." As such, the voltage difference in each of the unselected cells is reduced, and then the read disturbance can be prevented.

Please refer to table I, which shows the read operation for reading the page consisting of the strings S22, S25. In table I, the string select lines SSL2_$n$, SSL2_$n$+1 are selected to be applied the predetermined string select voltage Vssl; the unselected string select lines SSL2_$n$+2, SSL2_$n$+3 are applied 0 voltage. The ground select line GSL2_$n$ is selected to be applied the predetermined ground select voltage Vgsl; the unselected ground select lines GSL2_$n$+1, GSL2_$n$+2, GSL2_$n$+3 are applied 0 voltage. The common source line CSL2 is applied 0 voltage. The even bit lines BL2_even and the odd bit lines BL2_odd are all selected to be applied the predetermined voltage Vbl.

| | | GSL2_n | GSL2_n + 1 | GSL2_n + 2 | GSL2_n + 3 | CSL2 | BL2_even BL2_odd |
|---|---|---|---|---|---|---|---|
| | | | | Table I | | | |
| SSL2_n | Vssl | Vgsl | 0 | 0 | 0 | 0 | Vbl |
| SSL2_n + 1 | Vssl | | | | | | |
| SSL2_n + 1 | 0 | | | | | | |
| SSL2_n + 2 | 0 | | | | | | |
| SSL2_n + 2 | 0 | | | | | | |
| SSL2_n + 3 | 0 | | | | | | |
| SSL2_n + 3 | 0 | | | | | | |
| SSL2_n | Vssl | | | | | | |

Please refer to table II, which shows the read operation for reading the page 1. In table II, the string select lines SSL2_$n$+1, SSL2_$n$+2 are selected to be applied the predetermined string select voltage Vssl; the unselected string select lines SSL2_$n$, SSL2_$n$+3 are applied 0 voltage. The ground select line GSL2_$n$+1 is selected to be applied the predetermined ground select voltage Vgsl; the unselected ground select lines GSL2_$n$, GSL2_$n$+2, GSL2_$n$+3 are applied 0 voltage. The common source line CSL2 is applied 0 voltage. The even bit lines BL2_even and the odd bit lines BL2_odd are all selected to be applied the predetermined voltage Vbl.

| | | GSL2_n | GSL2_n + 1 | GSL2_n + 2 | GSL2_n + 3 | CSL2 | BL2_even BL2_odd |
|---|---|---|---|---|---|---|---|
| | | | | Table II | | | |
| SSL2_n | 0 | 0 | Vgsl | 0 | 0 | 0 | Vbl |
| SSL2_n + 1 | Vssl | | | | | | |
| SSL2_n + 1 | Vssl | | | | | | |
| SSL2_n + 2 | Vssl | | | | | | |
| SSL2_n + 2 | Vssl | | | | | | |
| SSL2_n + 3 | 0 | | | | | | |
| SSL2_n + 3 | 0 | | | | | | |
| SSL2_n | 0 | | | | | | |

Please refer to table III, which shows the read operation for reading the page 2. In table III, the string select lines SSL2_$n$+2, SSL2_$n$+3 are selected to be applied the predetermined string select voltage Vssl; the unselected string select lines SSL2_$n$, SSL2_$n$+1 are applied 0 voltage. The ground select line GSL2_$n$+2 is selected to be applied the predetermined ground select voltage Vgsl; the unselected ground select lines GSL2_$n$, GSL2_$n$+1, GSL2_$n$+3 are applied 0 voltage. The common source line CSL2 is applied 0 voltage. The even bit lines BL2_even and the odd bit lines BL2_odd are all selected to be applied the predetermined voltage Vbl.

| | | GSL2_n | GSL2_n + 1 | GSL2_n + 2 | GSL2_n + 3 | CSL2 | BL2_even BL2_odd |
|---|---|---|---|---|---|---|---|
| | | | | Table III | | | |
| SSL2_n | 0 | 0 | 0 | Vgsl | 0 | 0 | Vbl |
| SSL2_n + 1 | 0 | | | | | | |
| SSL2_n + 1 | 0 | | | | | | |
| SSL2_n + 2 | Vssl | | | | | | |
| SSL2_n + 2 | Vssl | | | | | | |
| SSL2_n + 3 | Vssl | | | | | | |
| SSL2_n + 3 | Vssl | | | | | | |
| SSL2_n | 0 | | | | | | |

Please refer to table IV, which shows the read operation for reading the page 3. In table IV, the string select lines SSL2_$n$+3, SSL2_$n$ are selected to be applied the predetermined string select voltage Vssl; the unselected string select lines SSL2_$n$+1, SSL2_$n$+2 are applied 0 voltage. The ground select line GSL2_$n$+3 is selected to be applied the predetermined ground select voltage Vgsl; the unselected ground select lines GSL2_$n$, GSL2_$n$+1, GSL2_$n$+2 are applied 0 voltage. The common source line CSL2 is applied 0 voltage. The even bit lines BL2_even and the odd bit lines BL2_odd are all selected to be applied the predetermined voltage Vbl.

Tale IV

|  |  | GSL2_n | GSL2_n + 1 | GSL2_n + 2 | GSL2_n + 3 | CSL2 | BL2_even BL2_odd |
|---|---|---|---|---|---|---|---|
| SSL2_n | Vssl | 0 | 0 | 0 | Vgsl | 0 | Vbl |
| SSL2_n + 1 | 0 |  |  |  |  |  |  |
| SSL2_n + 1 | 0 |  |  |  |  |  |  |
| SSL2_n + 2 | 0 |  |  |  |  |  |  |
| SSL2_n + 2 | 0 |  |  |  |  |  |  |
| SSL2_n + 3 | Vssl |  |  |  |  |  |  |
| SSL2_n + 3 | Vssl |  |  |  |  |  |  |
| SSL2_n | Vssl |  |  |  |  |  |  |

Base on above, during the all bit lines sensing scheme, the voltage difference between the gate and the channel in each unselected cell can be reduced to be "the difference between the pass voltage Vpass and the predetermined voltage level Vch" or "the difference between the pass voltage Vpass and the predetermined bit line voltage Vbl." As such, the read disturbance can be prevented.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A reading method of a memory, for preventing a read disturbance, the memory including a plurality of strings, the reading method comprising:
   selecting at least one of a plurality of string select lines and applying a predetermined string select voltage to the selected string select line;
   selecting only one of a plurality of ground select lines and applying a predetermined ground select voltage to the selected ground select line;
   selecting at least one of the strings, wherein the selected string is connected to the selected string select line and the selected ground select line, the unselected strings are floating, and a channel potential of each of the unselected strings is boosted to be a predetermined voltage level; and
   selecting one of a plurality of word lines, wherein the selected word line is applied a read voltage, and the unselected word line is applied a pass voltage.

2. The reading method of the memory according to claim 1, wherein the ground select lines are not connected together.

3. The reading method of the memory according to claim 1, wherein the ground select lines are decoded separately.

4. The reading method of the memory according to claim 1, wherein the unselected ground select lines are applied 0 voltage.

5. The reading method of the memory according to claim 1, further comprising:
   selecting a plurality of even bit lines or a plurality of odd bit lines to be applied a predetermined bit line voltage.

6. The reading method of the memory according to claim 1, wherein in the step of selecting the at least one of the string select lines, two of the string select lines are selected.

7. The reading method of the memory according to claim 6, wherein one of the strings which is connected to one of the selected string select lines and one of a plurality of even bit lines and another one of the strings which is connected to another one of the selected string select lines and one of a plurality of odd bit lines are regarded as one page.

8. A memory, comprising:
   a plurality of string select lines, wherein when the memory is read, at least one of the string select lines is selected by a decoder, and a predetermined string select voltage is applied to the selected string select line; and
   a plurality of ground select lines, wherein when the memory is read, only one of the ground select lines is selected by the decoder, and a predetermined ground select voltage is applied to the selected ground select line;
   wherein when the memory is read, at least one of the string select lines and only one of the ground select lines is selected by the decoder are selected by the decoder at the same time.

9. The memory according to claim 8, wherein the ground select lines are not connected together.

10. The memory according to claim 8, wherein the ground select lines are decoded separately by the decoder.

11. The memory according to claim 8, wherein the unselected ground select lines are applied 0 voltage.

12. The memory according to claim 8, further comprising:
    a plurality of strings, wherein at least one of the strings is selected, and the selected string is connected to the selected string select line and the selected ground select line.

13. The memory according to claim 12, wherein the unselected strings are floating.

14. The memory according to claim 13, wherein a channel potential of each of the unselected strings is boosted to be a predetermined voltage level.

15. The memory according to claim 8, further comprising:
    a plurality of even bit lines and a plurality of odd bit lines, wherein the even bit lines or the odd bit lines are selected to be applied a predetermined bit line voltage.

16. The memory according to claim 8, wherein two of the string select lines are selected.

17. The memory according to claim 16, further comprising:
    a plurality of strings, wherein one of the strings which is connected to one of the selected string select lines and one of a plurality of even bit lines and another one of the strings which is connected to another one of the selected string select lines and one of a plurality of odd bit lines are regarded as one page.

* * * * *